(12) United States Patent
Rogers et al.

(10) Patent No.: US 8,980,767 B2
(45) Date of Patent: Mar. 17, 2015

(54) METHODS AND APPARATUS FOR PROCESSING A SUBSTRATE

(71) Applicant: Applied Materials, Inc., Santa Clara, CA (US)

(72) Inventors: Matthew Rogers, Mountain View, CA (US); Martin Ripley, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 26 days.

(21) Appl. No.: 13/737,350

(22) Filed: Jan. 9, 2013

(65) Prior Publication Data
US 2013/0183834 A1 Jul. 18, 2013

Related U.S. Application Data

(60) Provisional application No. 61/586,186, filed on Jan. 13, 2012.

(51) Int. Cl.
*H01L 21/02* (2006.01)
*H01L 21/67* (2006.01)

(52) U.S. Cl.
CPC ...... *H01L 21/02263* (2013.01); *H01L 21/0217* (2013.01); *H01L 21/02301* (2013.01); *H01L 21/02312* (2013.01); *H01L 21/67115* (2013.01)
USPC .......................................... 438/788; 438/792

(58) Field of Classification Search
None
See application file for complete search history.

(56) References Cited

U.S. PATENT DOCUMENTS

| 6,139,923 | A * | 10/2000 | Gupta ........................... 427/579 |
| 8,056,500 | B2 | 11/2011 | Tseng et al. |
| 2004/0050496 | A1 * | 3/2004 | Iwai et al. ................ 156/345.51 |
| 2004/0266123 | A1 | 12/2004 | Cui et al. |
| 2008/0179010 | A1 * | 7/2008 | Bailey, III et al. ....... 156/345.43 |
| 2008/0230180 | A1 | 9/2008 | Yoneda et al. |
| 2010/0254064 | A1 | 10/2010 | Miyashita et al. |
| 2010/0323313 | A1 | 12/2010 | Toriya et al. |

OTHER PUBLICATIONS

International Search Report and Written Opinion mailed Apr. 12, 2013 for PCT Application No. PCT/US2013/021006.

* cited by examiner

*Primary Examiner* — Charles Garber
*Assistant Examiner* — Stanetta Isaac
(74) *Attorney, Agent, or Firm* — Moser Taboada; Alan Taboada

(57) ABSTRACT

Methods and apparatus for processing a substrate are provided. In some embodiments, a method of processing a substrate disposed in a process chamber includes performing a process on a substrate disposed in a process chamber having a substrate support ring configured to support the substrate and a reflector plate disposed proximate a back side of the substrate; providing a first gas comprising one of an oxygen containing gas or a nitrogen containing gas to a back side of the substrate via one or more through holes disposed in the reflector plate while performing the process on the substrate; and maintaining the process chamber at a first pressure proximate a top surface of the substrate and at a second pressure proximate the bottom surface of the substrate, wherein the first pressure is greater than the second pressure sufficiently to prevent dislodgement of the substrate from the substrate support ring during processing.

15 Claims, 4 Drawing Sheets

US 8,980,767 B2

METHODS AND APPARATUS FOR PROCESSING A SUBSTRATE

CROSS-REFERENCE TO RELATED APPLICATIONS

This application claims benefit of U.S. provisional patent application Ser. No. 61/586,186, filed Jan. 13, 2012, which is herein incorporated by reference.

FIELD

Embodiments of the present invention generally relate to semiconductor processing.

BACKGROUND

Some conventional semiconductor fabrication processes, for example anneal processes, may require a process chamber be maintained at high temperatures and low pressure to perform the process. However, the inventors have observed that performing a process at such temperature and pressure may undesirably cause sublimation of materials or diffusion of dopants from the substrate. For example, when annealing silicon-containing substrates, oxygen within the process chamber (e.g., moisture, residual material from previous processes performed in the process chamber, leakage from first gas supply, or the like) may attack the surfaces of the substrate, forming silicon oxide. The silicon oxide may then condense on surfaces of the process chamber, for example, side walls, reflector plates, pyrometers, or the like. In order to preserve process consistency, the process chamber requires periodic maintenance to remove the condensed materials, thus reducing processing efficiency and throughput.

Typically, in process chambers such as rapid thermal process (RTP) chambers, a gas having a low concentration of oxygen may be flowed to the front side of the substrate to prevent the aforementioned sublimation. However, such conventional process chambers typically have a large difference in gas conductance between the front side of a substrate and a back side of the substrate. This difference in gas conductance leads to an inadequate amount of oxygen reaching the back side of the substrate to prevent sublimation of materials from the back side of the substrate.

Therefore, the inventors have provided improved methods and apparatus for processing a substrate.

SUMMARY

Methods and apparatus for processing a substrate has been provided herein. In some embodiments, a method of processing a substrate disposed in a process chamber may include: performing a process on a substrate disposed in a process chamber having a substrate support ring configured to support the substrate and a reflector plate disposed proximate a back side of the substrate; providing a first gas comprising one of an oxygen containing gas or a nitrogen containing gas to a back side of the substrate via one or more through holes disposed in the reflector plate while performing the process on the substrate; and maintaining the process chamber at a first pressure proximate a top surface of the substrate and at a second pressure proximate the bottom surface of the substrate, wherein the first pressure is greater than the second pressure sufficiently to prevent dislodgement of the substrate from the substrate support ring during processing.

In some embodiments, a computer readable medium having instructions stored thereon that, when executed, cause a method for processing a substrate to be performed in a process chamber. The method may include any of the embodiments disclosed herein.

In some embodiments, an apparatus for processing a substrate may include: a process chamber having a substrate support ring configured to support a substrate and a reflector plate disposed proximate a back side of the substrate, the reflector plate having a plurality of through holes; wherein at least one of the plurality of through holes disposed in the reflector plate is an inlet to provide a first gas to an area proximate a back surface of the substrate; and wherein at least one of the plurality of through holes disposed in the reflector plate is an outlet to create a flow of the gases away from the back surface of the substrate.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
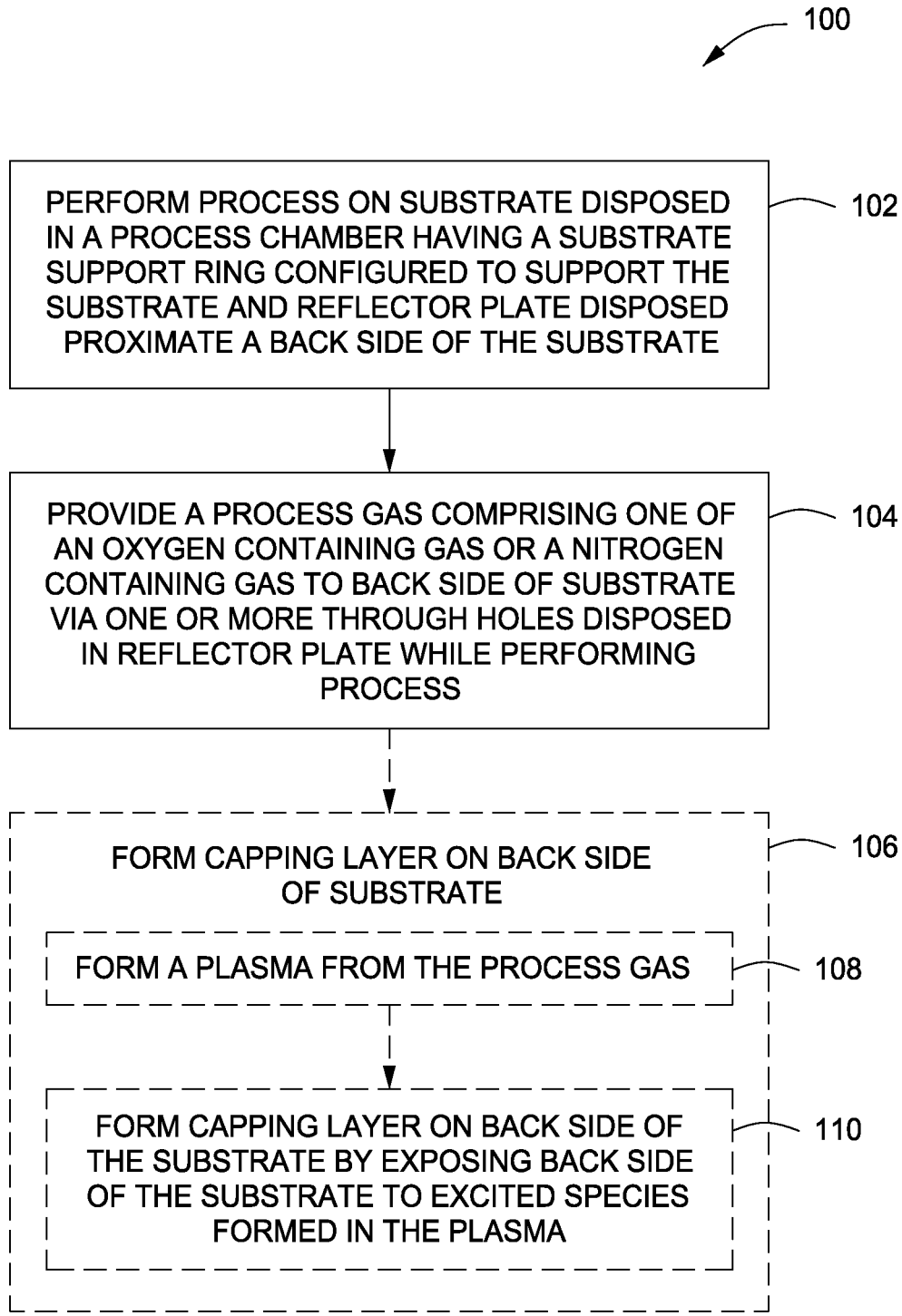
FIG. 1 depicts a method for processing a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide methods and apparatus for processing a substrate. Embodiments of the present invention may advantageously facilitate control over ambient conditions proximate a back side of a substrate to reduce a sublimation of materials or diffusion of dopants from a substrate, thereby reducing or preventing deposition of materials on surfaces of a process chamber, thus increasing production time before maintenance is necessary to clean the process chamber, and increasing process efficiency. In some embodiments, the present invention may provide for the deposition of a capping layer on the back side of the substrate, thus further reducing any sublimation of materials or diffusion of dopants from the back side of the substrate.

Figure 2A:
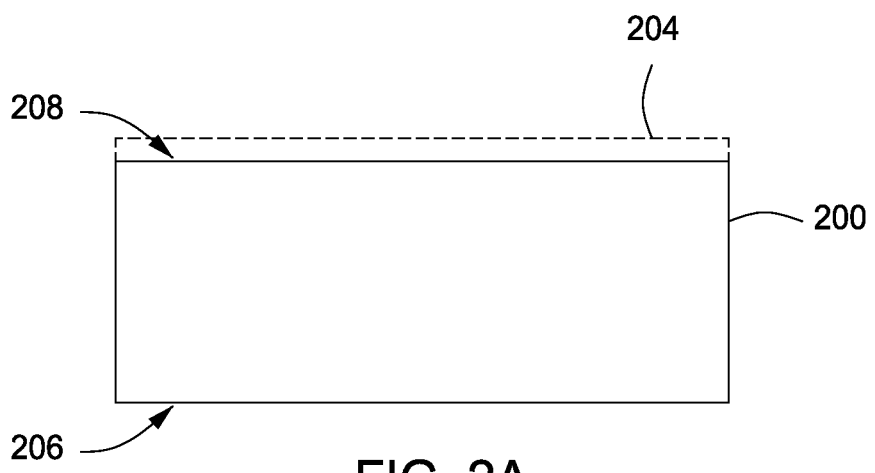
FIGS. 2A-B (collectively referred to as FIG. 2) depict a schematic side view of a substrate in various stages of the inventive method in accordance with some embodiments of the present invention.
Figure 2B:
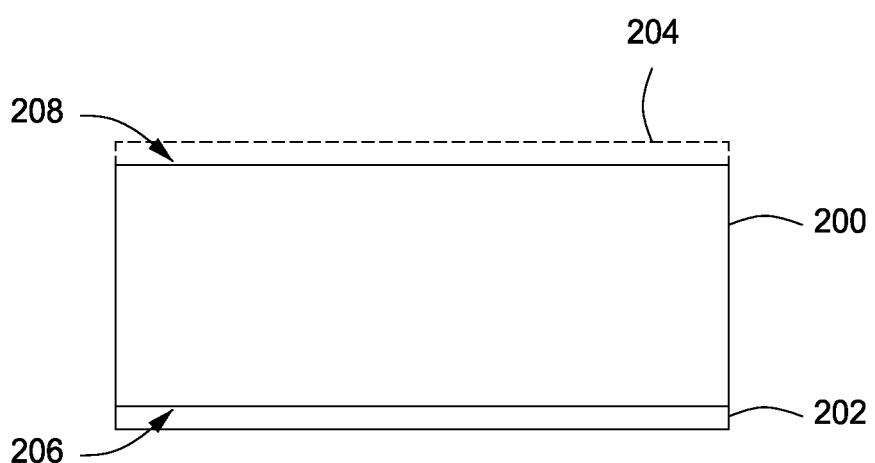

FIG. 1 depicts a method 100 for processing a substrate in accordance with some embodiments of the present invention. FIGS. 2A-B depict a substrate 200 through various stages of the inventive method 100 in accordance with some embodiments of the present invention. The method 100 may be performed in any process chamber suitable for semiconductor substrate processing, for example, such as a process chamber similar to the process chamber described below with respect to FIG. 3.

The method 100 generally begins at 102, where a process is performed on a substrate disposed in a process chamber having a substrate support ring configured to support a substrate and a reflector plate disposed proximate a back side of the substrate.

Referring to FIG. 2, the substrate 200 may be any type of substrate suitable for the fabrication of a semiconductor device. For example, the substrate 200 may be a doped or un-doped silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 200 may be a semiconductor wafer, such as a 200 or 300 mm semiconductor wafer.

In addition, in some embodiments, the substrate may comprise one or more components of a fully or partially fabricated semiconductor device. For example, in some embodiments, the substrate 200 may comprise one or more layers, one or more features, one or more fully or partially fabricated structures, or the like. For example, in some embodiments, the substrate 200 may comprise a layer (shown in phantom at 204) such as a nitride layer, oxide layer, or the like.

The process chamber may be any type of process chamber having a substrate support ring configured to support a substrate and a reflector plate disposed proximate a back side of the substrate. Examples of suitable process chambers includes any of the RADIANCE®, RADIANCE® PLUS, or VANTAGE® process chambers, or any other process chamber capable of performing a thermal process, for example a rapid thermal process (RTP), all available from Applied Materials, Inc., of Santa Clara, Calif. Other suitable process chambers, including those available from other manufacturers may also be used and/or modified in accordance with the teachings provided herein. In some embodiments, the process chamber may be similar to the process chamber described below with respect to FIG. 3.

The process performed on a substrate may be any process required to fabricate a semiconductor device, for example, a deposition process such as chemical vapor deposition (CVD), physical vapor deposition (PVD), or the like, an etch process such as a dry etch, wet etch, or the like, or an annealing process such as a rapid thermal anneal (RTA), post nitridation anneal, post oxidation anneal, or the like. For example, methods according to embodiments of the present invention may advantageously be used for processes above about 500 degrees Celsius where the backside of the substrate is not directly contacting a support (such as an edge ring). In addition, methods according to embodiments of the present invention may also advantageously facilitate measurements to be made from the backside of the substrate (such as temperature measurements using optical techniques) while minimizing or eliminating any process shift over time.

The inventors have observed that some processes, for example a post nitridation or post oxidation anneal process performed in a rapid thermal process (RTP) chamber, may require the process chamber be maintained at high temperatures (e.g. about 1000 degrees Celsius or greater) and low pressure (e.g., less than about 100 Torr, or in some embodiments, less than about 50 Torr, or less than about 10 Torr) to perform the process. However, the inventors have observed that performing the process at such temperature and pressure may undesirably cause sublimation of materials or diffusion of dopants from the substrate 200. For example, in annealing processes of silicon containing substrates, a small amount of oxygen may be present within the process chamber as a result of, for example, moisture, residual material from previous processes performed in the process chamber, leakage from first gas supply, or the like. The inventors have observed that the low concentration of oxygen present, high process temperature and/or a low partial pressure of oxygen (caused at least in part by the low process pressure) may result in sublimation of silicon oxide from the substrate. The sublimated silicon oxide material may then condense on surfaces of the process chamber, for example, side walls, reflector plates, pyrometers, or the like. The inventors have also observed that in process chambers such as rapid thermal process (RTP) chambers, an oxygen containing gas may be flowed to the front side of the substrate to prevent the aforementioned sublimation. For example, by providing the oxygen containing gas to the front side of the substrate, the concentration of oxygen and/or partial pressure of the oxygen is increased, thereby reducing or eliminating sublimation of material from the substrate (e.g., silicon oxide). However, the inventors have observed that due to a difference in flow conductance with respect to flow along a front side 208 of the substrate as compared to flow along a back side 206 of the substrate 200 in conventional process chambers, an inadequate amount of oxygen reaches the back side 206 of the substrate 200 to prevent sublimation of materials from the back side 206 of the substrate 200.

Accordingly, next at 104, a first gas comprising one of an oxygen containing gas or a nitrogen containing gas is provided to the back side 206 of the substrate 200. In some embodiments, the first gas may be provided to the back side of the substrate via one or more through holes disposed in a reflector plate disposed behind the substrate while performing the process. By providing first gas to the back side 206 of the substrate 200, the inventors have observed that the ambient conditions proximate the back side of the substrate (e.g., pressure, partial pressure of oxygen, concentration of oxygen, or the like) may be controlled, thereby reducing or eliminating sublimation of materials or diffusion of dopants (e.g., as described above) from the substrate 200. For example, in embodiments where the first gas is an oxygen containing gas, the inventors have observed that providing the oxygen containing gas increases a concentration of oxygen proximate the back side 206 of the substrate 200, thereby preventing the sublimation of silicon from the substrate 200, thus preventing the formation and subsequent deposition of silicon oxide on surfaces of the process chamber.

The oxygen containing gas or nitrogen containing gas may comprise any gas or combination of gases suitable to prevent the sublimation of materials or diffusion of dopants from the substrate 200 while being non-reactive in the process environment. For example, in embodiments where the first gas comprises an oxygen containing gas, the first gas may comprise one of oxygen ($O_2$) gas, nitrogen oxide ($NO_x$), or the like. In embodiments where the first gas comprises a nitrogen containing gas, the first gas may comprise one of nitrogen ($N_2$) gas, nitrogen oxide ($NO_x$), ammonia ($NH_3$), or the like. In some embodiments, the oxygen containing gas or nitrogen containing gas may be the same, or in some embodiments, different from a gas provided to the front side of the substrate (e.g., the oxygen containing gas may be flowed to the front side of the substrate described above).

The first gas may be provided at any flow rate suitable to provide a sufficient amount of oxygen or nitrogen containing gases while not causing a pressure differential great enough to dislodge the substrate 200 from the support ring during processing. For example, the pressure differential may be calculated using the following formula:

$$M_w * g = (P_{fs} - P_{fb}) * A_w$$

Wherein $M_w$ is the mass of the wafer (substrate), g is gravity, $P_{fs}$ and $P_{fb}$ is the pressure at the front side 208 and back side 206 of the substrate, respectively, and $A_w$ is the area of the wafer. For example, in embodiments where the substrate is a 300 mm wafer a pressure differential suitable to provide the first gas while not dislodging the substrate 200 from the support ring is less than about 2 Torr. Accordingly, in some embodiments, the first gas may be provided at a flow rate of about 50 to about 500 sccm. In some embodiments, the flow rate of the first gas may be increased over a period of time to prevent an initial burst of high pressure gas to the substrate 200. In such embodiments, the first gas may be providing at a first flow rate of about 10 to about 50 sccm and increased to a second flow rate of about 300 to about 500 sccm over a period of time of about 1 to about 5 seconds.

In some embodiments, for example where the required flow rate of the first gas would create a pressure differential that would cause a dislodging of the substrate 200, a vacuum may be applied to one or more of the one or more through holes disposed in the reflector plate to offset the pressure applied to the back side 206 of the substrate 200.

Next at 106, a capping layer 202 may be optionally formed on the back side 206 of the substrate 200, such as shown in FIG. 2B. The inventors have observed that by forming the capping layer 202 on the back side 206 of the substrate 200, the sublimation of materials or diffusion of dopants (e.g., as described above) from the substrate 200 may be further reduced or eliminated. The capping layer 202 may comprise any process-compatible materials suitable to prevent the sublimation of materials or diffusion of dopants (e.g., as described above) from the substrate 200 while not reacting with the substrate 200 materials, for example, a nitride layer, an oxide layer, or the like. For example, in embodiments where the substrate 200 is a silicon containing substrate 200, the capping layer 202 may comprise silicon nitride (SiN).

To form the capping layer 202, a plasma may be formed from the first gas, at 108. The plasma may be formed in the same process chamber utilized to process the substrate 200, or in some embodiments, may be formed in a different process chamber from the process chamber used to process the substrate and then subsequently provided to the process chamber (e.g., a remote plasma).

The plasma may be formed, for example, by igniting the first gas by coupling some energy to the first gas within a process chamber (e.g., the process chamber utilized to process the substrate or a remote plasma chamber) under suitable conditions to establish the plasma. In some embodiments, the energy coupled to the first gas may comprise up to about 3000 W of DC energy. Alternatively or in combination, in some embodiments, RF energy may be supplied at up to about 10,000 W at a frequency of about 2 MHz to about 3 GHz. For example, in some embodiments, the gas supply 331 may be a remote plasma chamber to form a plasma from the first gas prior to providing the first gas to the process chamber.

In addition to the above, additional process parameters may be utilized to ignite or maintain the plasma. For example, in some embodiments, the process chamber may be maintained at a pressure of about 10 to about 5000 mTorr. In addition, in some embodiments, the process chamber may be maintained at a temperature of about 500 to about 1100 degrees Celsius.

Next, at 110, the back side 206 of the substrate may be exposed to excited species formed in the plasma to form the capping layer 202 on the back side 206 of the substrate 200. The back side 206 of the substrate 200 may be exposed to the excited species for any amount of time necessary to form the capping layer 202 to a desired thickness. For example, in some embodiments, the back side 206 of the substrate 200 may be exposed to the plasma for a period of time of about 10 to about 60 seconds. In some embodiments, the capping layer 202 may be formed to a thickness of about 5 to about 30 angstroms.

In addition to the above, additional process parameters may be utilized to form the capping layer. For example, in some embodiments, the process chamber may be maintained at a pressure of about 10 to about 5000 mTorr. In addition, in some embodiments, the process chamber may be maintained at a temperature of about 200 to about 1100 degrees Celsius.

Following providing the first gas at 104 (or optionally forming the capping layer 206 at 106) the method generally ends and the substrate 200 may be further processed as desired. For example, in some embodiments, additional processes such as additional layer depositions, etching, annealing, or the like, may be performed on the substrate 200, for example, to form a semiconductor device on the substrate 200 or to prepare the substrate 200 for use in applications including but not limited to such as photovoltaic cells (PV), light emitting diodes (LED), or displays (e.g., liquid crystal display (LCD), plasma display, electro luminescence (EL) lamp display, or the like).

Figure 3:
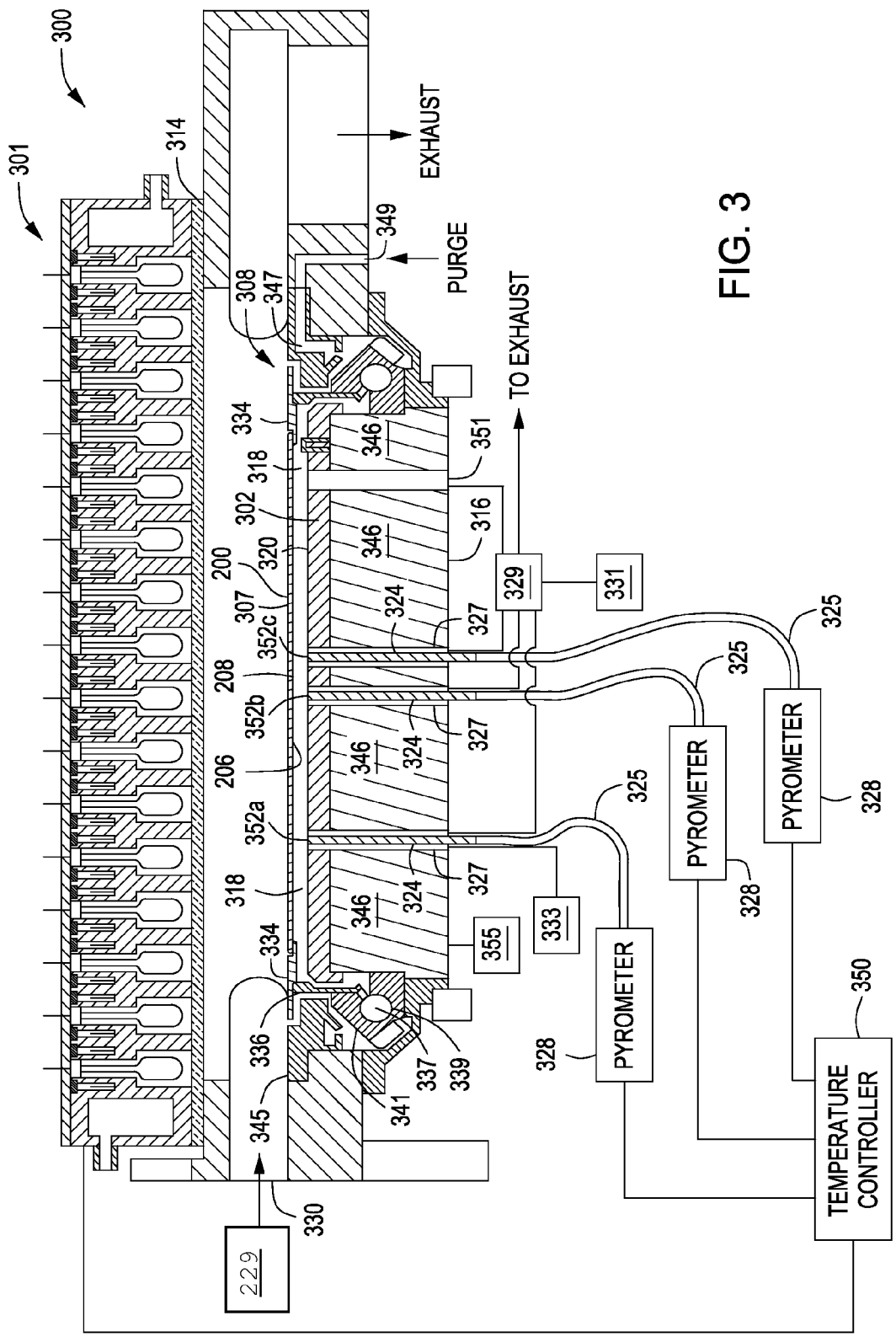
FIG. 3 depicts a schematic side view of a process chamber suitable for performing the inventive method in accordance with some embodiments of the present invention.

FIG. 3 depicts a process chamber suitable for performing the inventive method in accordance with some embodiments of the present invention. The process chamber 300 may be any suitable process chamber, for example, configured for thermal processing, such as a rapid thermal process (RTP), or any of the process chambers described above.

The substrate 200 is mounted inside the process chamber 300 on a substrate support 308 and is heated by the lamp head 301, which is disposed in a position opposing the substrate support 308. The lamp head 301 generates radiation which is directed to a front side 208 of the substrate 200. Alternatively (not shown), the lamp head 301 may be configured to heat the back side 206 of the substrate 200, for example, such as by being disposed below the substrate 200, or by directing the radiation to the back side of the substrate 200. The radiation enters the process chamber 300 through a water-cooled quartz window assembly 314. Beneath the substrate 200 is a reflector plate 302, which is mounted on a water-cooled, stainless steel base 316. The base 316 includes a circulation circuit 346 through which coolant circulate to cool the reflector 302. In some embodiments, the reflector plate 302 is made of aluminum and has a highly reflective surface coating 320. Water, may be circulated through the base 316 to keep the temperature of the reflector plate 302 well below that of the heated substrate 200. Alternatively, other coolants may be provided at the same or different temperatures. For example, antifreeze (e.g., ethylene glycol, propylene glycol, or the like) or other heat transfer fluids may be circulated through the base 316 and/or the base 316 may be coupled to a chiller (not shown). An underside or back side of the substrate 200 and the top of the reflector plate 302 form a reflecting cavity 318. The reflecting cavity 318 enhances the effective emissivity of the substrate 200.

The temperatures at localized regions of the substrate 200 are measured by a plurality of temperature probes, such as 352a, 352b, and 352c. Each temperature probe includes a light pipe 324 that passes through a through hole 327 that extends from the back side of the base 316 through the top of the reflector plate 302. The light pipe 324 is positioned within the through hole 327 so that its uppermost end is flush with or slightly below the upper surface of the reflector plate 302. The other end of light pipe 324 couples to a flexible optical fiber 325 that transmits sampled light from the reflecting cavity 318 to a pyrometer 328. The pyrometer 328 is connected to a temperature controller 350 which controls the power supplied to the lamp head 301 in response to a measured temperature. The lamps may be divided into multiple zones. The zones can be individually adjusted by the controller to allow controlled radiative heating of different areas of the substrate 200.

In addition to the through hole 327 configured to accommodate each light pipe, as described above, the base 346 and reflector plate 302 may comprise one or more additional through holes (one additional through hole 351 shown) configured to accommodate other mechanisms to facilitate processing, for example, lift pins, or the like.

During processing, the first gas may be flowed from a gas panel (e.g., gas supply 229) and enter the process chamber 300 at an inlet 330 (e.g., a first inlet). The inlet 330 is disposed in a side of the process chamber 300 and facilitates the flow of the first gas across the surface of the substrate 300. The inventors have observed that providing the first gas from the inlet 330 may cause a gas conductive difference from a front side 208 to a back side 206 of the substrate 200. For example, as the first gas is provided to the front side 208 of the substrate 200 via inlet 330 the first gas flows in a first flow path directly across the front side 208 of the substrate 200 and an indirect second flow path to the back side 206 of the substrate 200. The flow conductance difference between the first flow path and the second flow path cause a lower concentration of first gas to reach the back side 206 of the substrate as compared to the front side 208 of the substrate 200. The inventors have observed that this lower concentration of first gas may lead to process inadequacies, for example, such as the sublimation of materials or diffusion out of dopants from the back side 206 of the substrate 200 as described above.

Accordingly, in some embodiments, the first gas may be provided to the back side of the substrate 200 through a second inlet proximate the back side of the substrate. For example, in some embodiments, the first gas may be provided to the back side of the substrate via one or more of the through holes (e.g., through holes 327, 351) of the reflector plate 320.

In some embodiments, the first gas may be provided to one or more of the though holes 327, 351 via a gas supply 331. Although shown as a separate gas supplies, gas supply 229 and gas supply 331 may be the same gas supply with independent flow controllers to provide the first gas to the front side or the back side of the substrate as needed. In some embodiments, a valve 329 may be coupled to the one or more through holes, for example, disposed between the gas supply 331 and through holes 327, 351 to facilitate directing the first gases to one of the through holes 327, 351 or the exhaust. By providing the valve 329 between the gas supply 331 and though holes 327, 351, the gas supply 331 may be maintained in a constant "on" state, providing the first gas to either the through holes 327, 351 or exhaust, thereby maintaining a more uniform pressure and reducing instances of a high pressure burst from the gas supply upon starting a flow of first gas when directed towards the through holes 327, 351.

Figure 4:
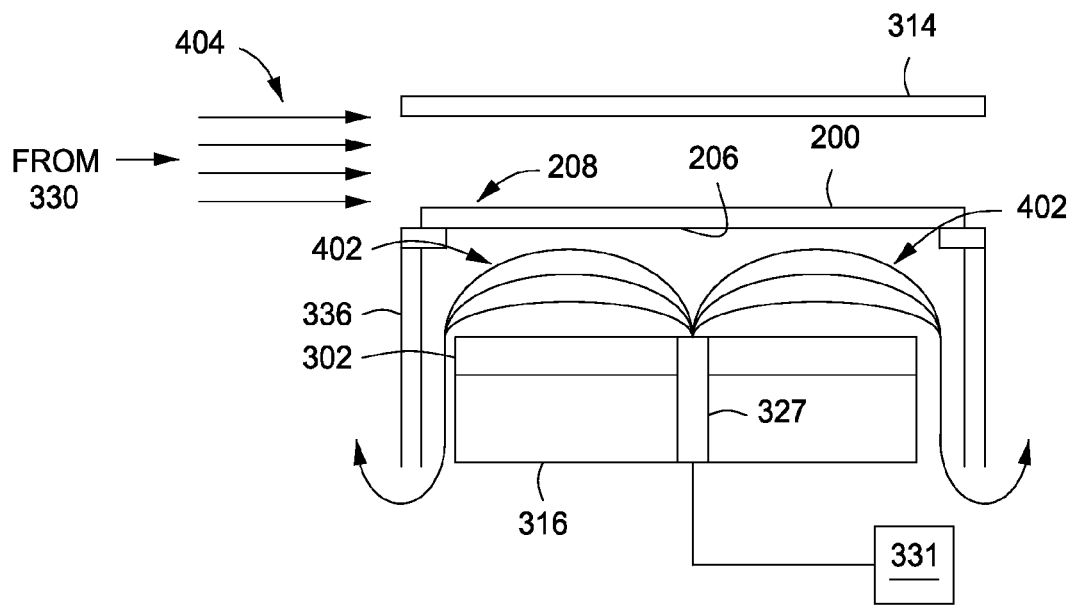
FIGS. 4-5 depict schematic side view of portions of a process chamber suitable for performing the inventive method in accordance with some embodiments of the present invention.

By providing the first gas via one or more of the through holes 327, 351, a flow path 402 is created below the substrate 200 in addition to the flow path 404 above the substrate 200, such as shown in FIG. 4. The inventors have observed that the providing the flow path 402 may reduce or eliminate the gas flow conductance difference from the front side 208 to the back side 206 of the substrate 200, thereby facilitating providing a higher concentration of first gas to the back side 206 of the substrate 200, thus reducing or eliminating the process inadequacies discussed above.

Figure 5:
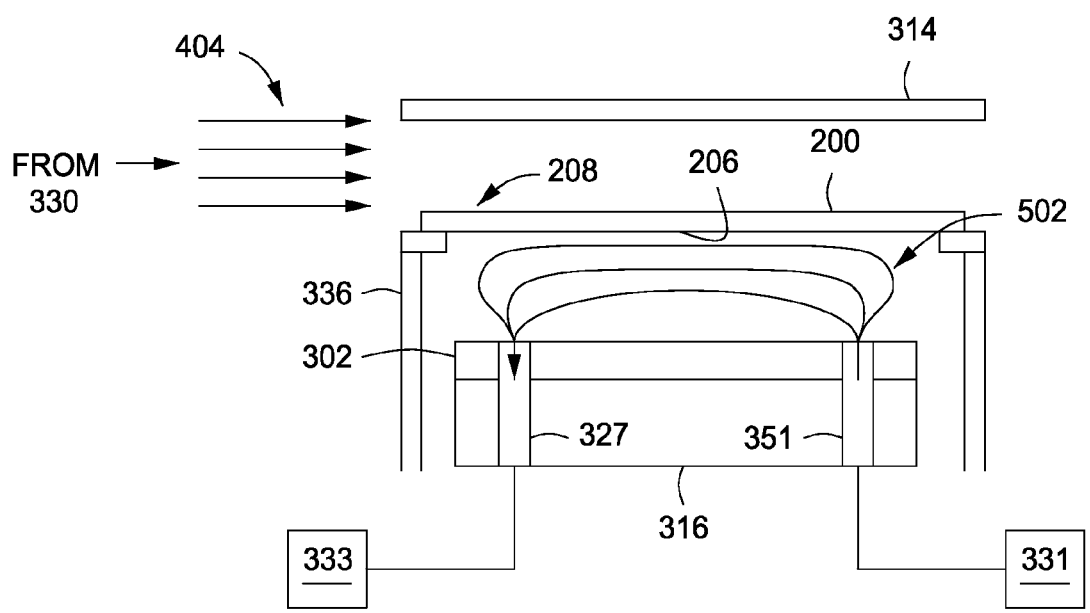

In some embodiments, a vacuum may be provided to region proximate the back side of the substrate 200. In some embodiments, the vacuum may be provided to one or more of the through holes (e.g., through hole 327) while providing the first gas to another of the one or more through holes (e.g., through hole 351), thereby creating a flow path from a first through hole of the one or more through holes (e.g., through hole 327) to a second through hole of the one or more through holes (e.g., through hole 351), for example as shown by the flow path 502 in FIG. 5. By providing a vacuum to one or more of the through holes, an amount of pressure applied to the back side 206 of the substrate 200 may be reduced, thereby reducing a pressure differential between the front side 208 and back side 206 of the substrate 200 and, thus, reducing the risk of dislodging of the substrate 200 from the substrate support (as described above). In such embodiments, a pump 333, for example such as a roughing pump or vacuum pump may be coupled to one or more of the through holes. In some embodiments, the through hole to which the vacuum is applied may have a larger diameter than other through holes to prevent a restriction of air flow to the pump 333. The pump 333, and the conduits coupling the pump to the one or more through holes, has a conductance and power sufficient to provide the pressure differential discussed above.

Referring back to FIG. 3, the substrate support 308 may be configured to be stationary or may rotate the substrate 200. The substrate support 308 includes a support or an edge ring 334 which contacts the substrate 200 around the substrate's outer perimeter, thereby leaving the entire underside of the substrate 200 exposed except for a small annular region about the outer perimeter. The support ring 334 is also known as the edge ring 334 and these two terms can be interchangeably used within the specification. To minimize the thermal discontinuities that may occur at the edge of the substrate 200 during processing, the support ring 334 may be made of the same, or similar, material as that of the substrate 200, for example, silicon.

In some embodiments, the support ring 334 may rest on a rotatable tubular cylinder 336 that is coated with silicon to render it opaque in the frequency range of the pyrometer 328. The coating on the cylinder 336 acts as a baffle to block out radiation from the external sources that might contaminate the intensity measurements. The bottom of the cylinder 336 is held by an annular upper bearing 341 which rests on a plurality of ball bearings 337 that are, in turn, held within a stationary, annular, lower bearing race 339. In some embodiments, the ball bearings 337 are made of steel and coated with silicon nitride to reduce particulate formation during operations. The upper bearing 341 is magnetically coupled to an actuator (not shown) which rotates the cylinder 336, the edge ring 334 and the substrate 200 during the thermal processing.

A purge ring 345, which is fitted into the chamber body, surrounds the cylinder 336. In some embodiments, the purge ring 345 has an internal annular cavity 347 which opens up to a region above the upper bearing 341. The internal cavity 347 is connected to a gas supply (not shown) through a passageway 349. During processing, a purge gas is flowed into the chamber through the purge ring 345.

In some embodiments, the support ring 334 has an outer radius that is larger than the radius of the cylinder 336 so that it extends out beyond the cylinder 336. The annular extension of the support ring 334 beyond the cylinder 336, in cooperation with the purge ring 345 located below it, functions as a baffle which prevents stray light from entering the reflecting cavity 318 at the back side of the substrate 200. To further reduce the possibility of stray light entering into the reflecting cavity 318, the support ring 334 and the purge ring 345 may also be coated with a material (for example, a black or gray material) that absorbs the radiation generated by the lamp head 301.

The substrate support 208 may be coupled to a lift mechanism 355 capable of raising and lowering the substrate with respect to the lamp head 301. For example, the substrate support 308 may be coupled to the lift mechanism 355, such that a distance between the substrate 200 and the reflector 302 is constant during the lifting motion.

In some embodiments, the substrate support 308 can be adapted to magnetically levitate and rotate within the process chamber 300 (not shown). The substrate support 308 is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

Thus, methods and apparatus for processing a substrate have been provided herein. Embodiments of the present invention provide methods for processing a substrate. In some embodiments, the present invention may facilitate an adequate flow of first gases to a back side of a substrate to reduce a sublimation of materials or diffusion of dopants from a substrate, thereby preventing a deposition of materials on surfaces of a process chamber, thus increasing process efficiency. In some embodiments, the present invention may provide the deposition of a capping layer on the back side of the substrate, thus further reducing a sublimation of materials or diffusion of dopants from a substrate.

While the foregoing is directed to embodiments of the present invention, other and further embodiments of the invention may be devised without departing from the basic scope thereof.

The invention claimed is:

1. A method of processing a substrate disposed in a process chamber, comprising:
   performing a process on a substrate disposed in a process chamber having a substrate support ring configured to support the substrate and a reflector plate disposed proximate a back side of the substrate;
   providing a first gas comprising one of an oxygen containing gas or a nitrogen containing gas to a back side of the substrate via one or more through holes disposed in the reflector plate while performing the process on the substrate;
   providing the first gas to a front side of the substrate at the same time as providing the first gas to the back side of the substrate; and
   maintaining the process chamber at a first pressure proximate a top surface of the substrate and at a second pressure proximate the bottom surface of the substrate, wherein the first pressure is greater than the second pressure sufficiently to prevent dislodgement of the substrate from the substrate support ring during processing.

2. The method of claim 1, further comprising:
   applying a vacuum to one or more of the one or more through holes to create a flow of the first gas away from the back side of the substrate to reduce an amount of pressure applied to the back side of the substrate.

3. The method of claim 1, wherein the one or more through holes are configured to accommodate at least one of lift pins or temperature sensors.

4. The method of claim 1, wherein the process is an annealing process.

5. The method of claim 1, wherein the first pressure is greater than the second pressure by at least 2 Torr.

6. The method of claim 1, wherein the process chamber is a rapid thermal process (RTP) chamber.

7. The method of claim 1, wherein providing the first gas comprises:
   providing the first gas at a first flow rate; and
   increasing the first flow rate to a second flow rate over a period of time.

8. The method of claim 7, wherein the first flow rate is about 10 to about 50 sccm, wherein the second flow rate is about 300 to about 500 sccm, and wherein the period of time is about 1 to about 5 seconds.

9. The method of claim 1, further comprising:
   forming a plasma from the first gas; and
   forming a capping layer on the back side of the substrate by exposing the back side of the substrate to excited species formed by the plasma.

10. The method of claim 9, wherein forming the capping layer comprises forming the capping layer to a thickness of about 5 to about 40 angstroms.

11. The method of claim 9, further comprising:
    maintaining the process chamber at a temperature of about 200 to about 1100 degrees Celsius while forming the capping layer.

12. The method of 9, wherein forming the plasma from the first gas comprises:
    forming the plasma in a remote plasma chamber; and
    providing the plasma to the process chamber.

13. The method of claim 9, wherein the capping layer is one of a nitride layer or an oxide layer.

14. A computer readable medium having instructions stored thereon that, when executed, cause a method for processing a substrate to be performed in a process chamber, the method comprising:
    performing a process on a substrate disposed in a process chamber having a substrate support ring configured to support the substrate and a reflector plate disposed proximate a back side of the substrate;
    providing a first gas comprising one of an oxygen containing gas or a nitrogen containing gas to a back side of the substrate via one or more through holes disposed in the reflector plate while performing the process on the substrate;
    providing the first gas to a front side of the substrate at the same time as providing the first gas to the back side of the substrate; and
    maintaining the process chamber at a first pressure proximate a top surface of the substrate and at a second pressure proximate the bottom surface of the substrate, wherein the first pressure is greater than the second pressure sufficiently to prevent dislodgement of the substrate from the substrate support ring during processing.

15. The computer readable medium of claim 14, wherein the method further comprises:
    forming a plasma from the first gas; and
    forming a capping layer on the back side of the substrate by exposing the back side of the substrate to excited species formed in the plasma.

* * * * *